(12) United States Patent
Sato et al.

(10) Patent No.: US 9,578,688 B2
(45) Date of Patent: Feb. 21, 2017

(54) HEAT TREATMENT APPARATUS AND HEAT TREATMENT METHOD

(71) Applicant: TOKYO ELECTRON LIMITED, Tokyo (JP)

(72) Inventors: Hidekazu Sato, Oshu (JP); Hideki Takahashi, Oshu (JP); Tsutomu Yamamoto, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/799,623

(22) Filed: Jul. 15, 2015

(65) Prior Publication Data
US 2016/0027661 A1    Jan. 28, 2016

(30) Foreign Application Priority Data
Jul. 24, 2014    (JP) ................................. 2014-150438

(51) Int. Cl.
| | |
|---|---|
| *H01L 21/00* | (2006.01) |
| *H05B 3/00* | (2006.01) |
| *H05B 3/44* | (2006.01) |
| *H01L 21/67* | (2006.01) |

(52) U.S. Cl.
CPC ....... *H05B 3/0047* (2013.01); *H01L 21/67109* (2013.01); *H05B 3/44* (2013.01); *H05B 2203/014* (2013.01); *H05B 2203/032* (2013.01)

(58) Field of Classification Search
CPC .................... H01L 21/67098; H01L 21/67103; H01L 21/67109; H01L 21/67115
See application file for complete search history.

(56) References Cited

U.S. PATENT DOCUMENTS

| | | | | |
|---|---|---|---|---|
| 5,282,878 A | * | 2/1994 | Komiyama | C03B 11/12 65/102 |
| 5,507,639 A | * | 4/1996 | Monoe | C23C 16/481 432/123 |
| 2004/0134556 A1 | * | 7/2004 | Manini | F16L 59/065 138/149 |
| 2008/0153314 A1 | * | 6/2008 | Hayashida | H01L 21/67109 438/795 |
| 2009/0170338 A1 | * | 7/2009 | Terasaki | C23C 16/4412 438/758 |
| 2014/0335305 A1 | * | 11/2014 | Syryda | F16L 59/029 428/100 |

FOREIGN PATENT DOCUMENTS

JP        2014-003119 A        1/2014

* cited by examiner

*Primary Examiner* — Zandra Smith
*Assistant Examiner* — Evan Clinton
(74) *Attorney, Agent, or Firm* — Nath, Goldberg & Meyer; Jerald L. Meyer

(57) ABSTRACT

There is provided a heat treatment apparatus, including: a processing container configured to perform a heat treatment on substrates accommodated in the processing container; a heating unit configured to cover an outer circumference of the processing container with a predetermined space defined the heating unit and the processing container; a discharge pipe installed outside of the processing container and within the predetermined space, and configured to communicate with an interior of the processing container to discharge an exhaust gas from the interior of the processing container; and a heat insulating member configured to cover a circumference of the discharge pipe.

18 Claims, 14 Drawing Sheets

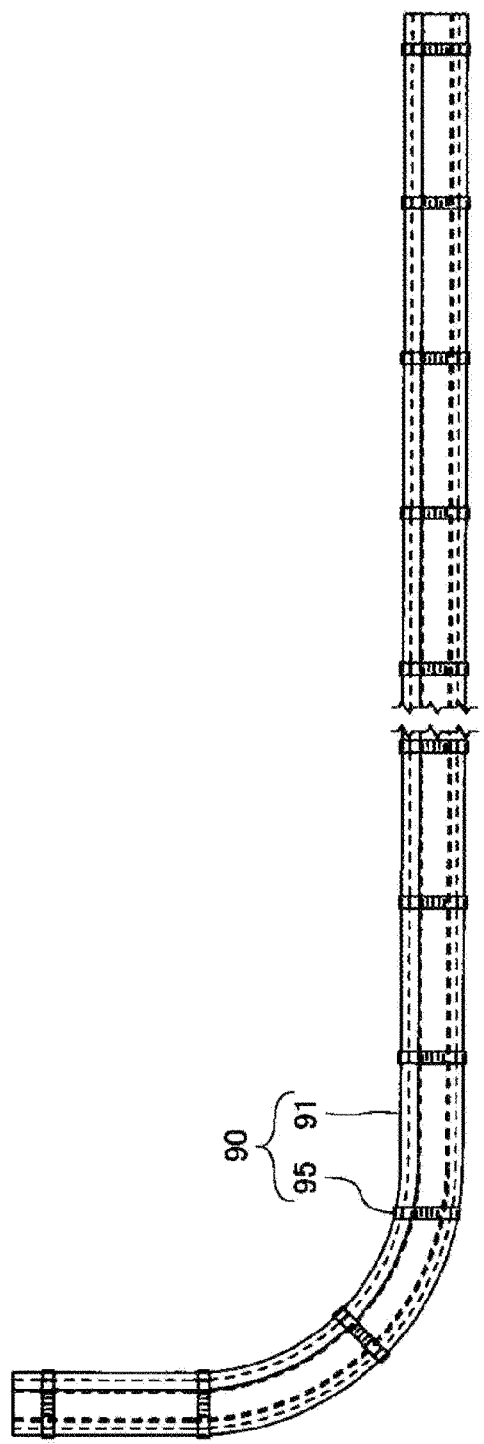

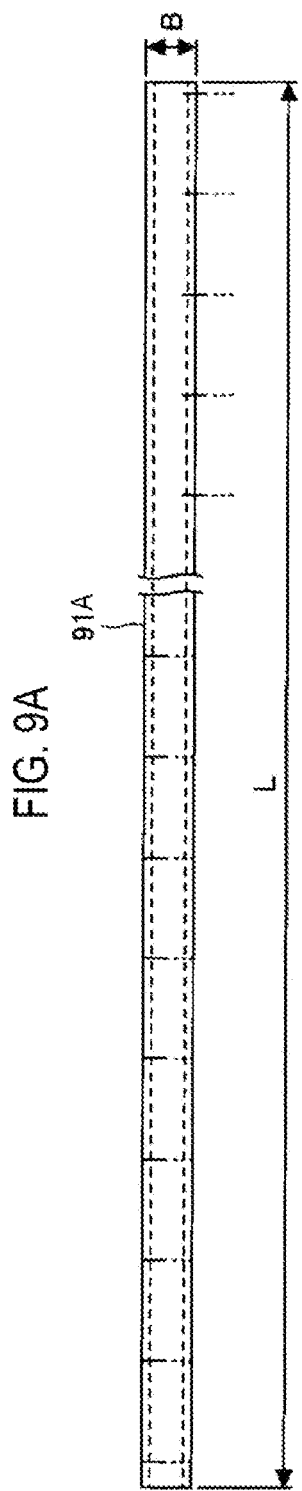

HEAT TREATMENT APPARATUS AND HEAT TREATMENT METHOD

CROSS-REFERENCE TO RELATED APPLICATION

This application claims the benefit of Japanese Patent Application No. 2014-150438, filed on Jul. 24, 2014, in the Japan Patent Office, the disclosure of which is incorporated herein in its entirety by reference.

TECHNICAL FIELD

The present disclosure relates a heat treatment apparatus and a heat treatment method.

BACKGROUND

A heat treatment apparatus which performs a heat treatment on a plural sheets of substrates held by a holding unit while flowing an inert gas upward from below into a vertical processing container with a heating unit installed therearound, has been known. This heat treatment apparatus includes: a gas supply system which is installed in a lower end portion of the processing container to supply an inert gas; a gas supply header unit installed to flow the inert gas in a circumference direction of the processing container; and a gas introduction unit installed in the gas supply header unit to supply the inert gas into the processing container.

In this configuration, since the gas supply header is installed along an outer circumferential wall of the heated processing container, the introduced inert gas may be supplied into the processing container, while being heated. When the inert gas is introduced at a level of normal temperature, a cold spot is generated. This condenses a vaporized gas containing a photosensitizing agent included in a photoresist which is applied onto a surface of a substrate, thus causing a phenomenon in which a powder or liquid deposit adheres to a lower portion of the processing container. The conventional heat treatment apparatus suppresses the adhesion of the deposit to the lower portion of the processing container.

In addition, the vaporized gas which is obtained when moisture, solvent or the like included in the photoresist is vaporized during a heat treatment, is carried together with the inert gas when the inert gas introduced from the gas supply header unit flows upward from below within the processing container. Subsequently, the vaporized gas reaches a ceiling portion of the processing container, followed by being discharged to the outside through an exhaust pipe installed to communicate with an upper portion of the processing container.

However, although the conventional heat treatment apparatus suppresses the deposit from adhering to the lower portion of the processing container while the processing container is being heated, it fails to suppress the deposit from being generated while the processing container is not heated after the processing is terminated.

In particular, recently, it is sometimes the case that, from the viewpoint of improving productivity, a cooling process is applied to initiate a subsequent heat treatment after the termination of the current heat treatment in a short period of time, without waiting for a natural cooling of the heat treatment apparatus. To do this, the cooling process uses a cooling unit to positively cooling down the processing container by an air cooling from the surrounding of the processing container. In the cooling process, an exhaust gas generated from the processing container is condensed within an exhaust pipe due to residual heat obtained when the heat treatment is terminated or after the heat treatment is terminated, so that the condensate adheres to the interior of the exhaust pipe.

SUMMARY

Some embodiments of the present disclosure provide a heat treatment apparatus and a heat treatment method, which are capable of suppressing a condensate from generating within a discharge pipe.

According to one embodiment of the present disclosure, there is provided a heat treatment apparatus, including: a processing container configured to perform a heat treatment on substrates accommodated in the processing container; a heating unit configured to cover an outer circumference of the processing container with a predetermined space defined the heating unit and the processing container; a discharge pipe installed outside of the processing container and within the predetermined space, and configured to communicate with an interior of the processing container to discharge an exhaust gas from the interior of the processing container; and a heat insulating member configured to cover a circumference of the discharge pipe.

According to another embodiment of the present disclosure, there is provided a heat treatment method, including: accommodating substrates within a processing container; heating, by a heating unit, the processing container from a circumference of the processing container such that the substrates are subjected to a heat treatment; discharging gas generated within the processing container through a discharge pipe, the discharge pipe being installed in a space between the processing container and the heating unit and a circumference of the discharge pipe is covered with an heat insulating member; stopping the heating by the heating unit to complete the heat treatment for the substrates; and cooling down the space between the processing container and the heating unit.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 8A to 8C are views showing a detailed configuration of the heat insulating member shown in FIGS. 7A and 7B.

FIGS. 9A and 9B are views showing an example of a configuration of another heat insulating member for covering the discharge pipe of the heat treatment apparatus according to another embodiment of the present disclosure.

DETAILED DESCRIPTION

Reference will now be made in detail to various embodiments, examples of which are shown in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
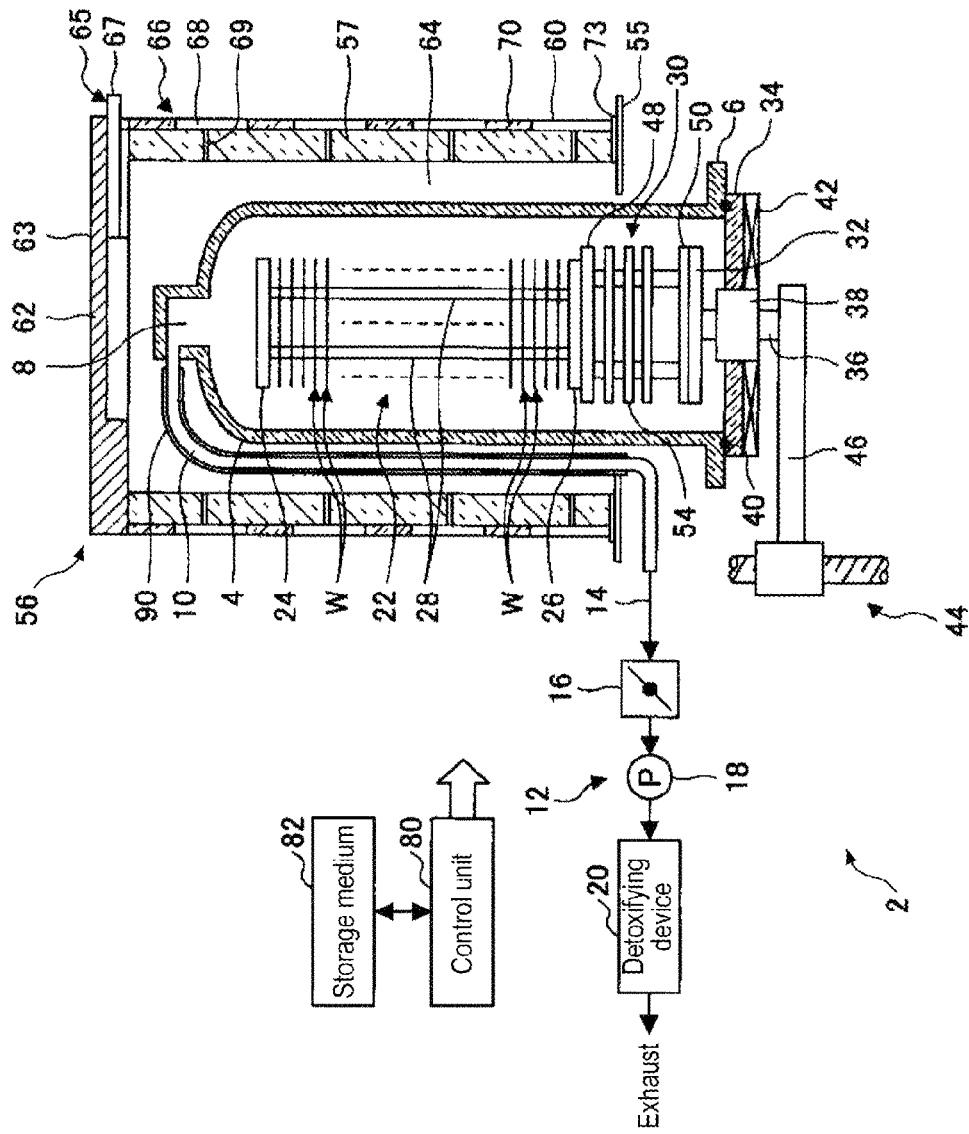
FIG. 1 is a view showing a configuration of an example of a heat treatment apparatus according to an embodiment of the present disclosure.

FIG. 1 is a view showing a configuration of an example of a heat treatment apparatus according to an embodiment of the present disclosure.

As shown in FIG. 1, a heat treatment apparatus 2 includes a batch type processing container 4 of which a lower end portion is opened. The processing container 4 is formed in an elongated cylindrical shape. The processing container 4 is made of, e.g., quartz having high heat resistance. A flange part 6 is installed in the lower end portion of the processing container 4. An upwardly-protruded exhaust chamber 8 is formed in a ceiling portion of the processing container 4. A discharge pipe 10 made of, e.g., quartz, is installed to extend from the exhaust chamber 8. The discharge pipe 10 is installed to extend downwardly along an outer wall of the processing container 4 and to be horizontally bent in a lower portion of the processing container 4. The discharge pipe 10 is connected to an exhaust system 12 such that an internal atmosphere of the processing container 4 is exhausted.

The exhaust system 12 includes a gas exhaust channel 14 formed of, e.g., a stainless steel, which is connected to an end portion of the discharge pipe 10. A pressure regulating valve 16, an exhaust pump 18, and a detoxifying device 20 are sequentially installed in the gas exhaust channel 14 from an upstream side of the gas exhaust channel 14 toward a downstream side thereof. An internal pressure of the processing container 4 may be regulated by controlling the pressure regulating valve 16. An example of the exhaust pump 18 may include an ejector. If a processing pressure closes to a normal pressure, the exhaust pump 18 may be omitted. The detoxifying device 20 is configured to remove a harmful material included in an exhaust gas.

A heat insulating member 90 is installed around the discharge pipe 10. The heat insulating member 90 is installed to cover an outer circumference of the discharge pipe 10 while extending in a length direction of the discharge pipe 10. The heat insulating member 90 is provided to keep the discharge pipe 10 warm such that a by-product generated by condensation within the discharge pipe 10 is prevented from adhering to an inner wall of the discharge pipe 10. The following is a detailed description of the heat insulating member 90.

Further, a wafer boat 22, which is a holding unit for holding semiconductor wafers W (used as a plurality of substrates), may be vertically inserted into or separated from (loaded into or unloaded from) the processing container 4 through a lower end opening of the processing container 4. The wafer boat 22 is entirely formed of, e.g., quartz. Specifically, the wafer boat 22 includes a ceiling plate 24 and a bottom plate 26. A plurality of (e.g., four) pillars 28 (only two pillars are shown in FIG. 1) is installed between the ceiling plate 24 and the bottom plate 26.

Support recesses (not shown) are formed in each of the pillars 28 at predetermined pitches. Peripheral portions of the wafers W are supported by the support recesses such that the plurality of wafers W is held in multi stages. Further, the wafers W may be loaded into and unloaded from the wafer boat 22 through one side of the wafer boat 22 in a horizontal direction. The wafer boat 22 is configured to hold about 50 to 150 wafers W having a diameter of, e.g., 300 mm.

The wafer boat 22 is mounted on a table 32 with a quartz heat retaining unit 30 interposed between the wafer boat 22 and the table 32. The table 32 is installed on an upper end portion of a rotational shaft 36 that penetrates through a cover 34 for opening and closing the lower end opening of the processing container 4. Further, a portion at which the rotational shaft 36 penetrates through the cover 34 is fitted with, e.g., a magnetic fluid seal 38 to air-tightly seal the penetrating portion while rotatably supporting the rotational shaft 36. In addition, a sealing member 40 such as an O-ring is installed between a peripheral portion of the cover 34 and the flange part 6 of the processing container 4 such that a sealing property of the processing container 4 is maintained. Further, a heating unit 42 configured to heat the cover 34 is installed in the cover 34.

The rotational shaft 36 is installed in a leading end of an arm 46 supported by a lifting mechanism 44 such as a boat elevator and is configured to move upward and downward the wafer boat 22, the cover 34 and the like together. The entire of the heat retaining unit 30 is formed of quartz, as described above.

Figure 2:
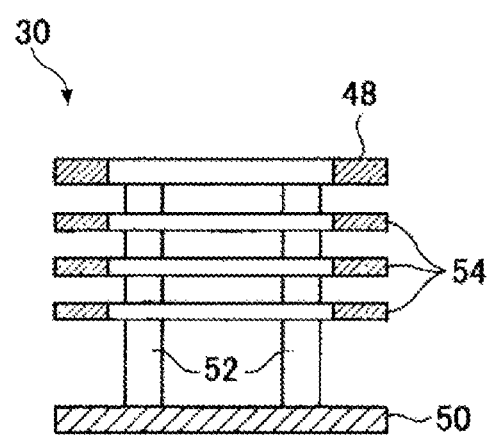
FIG. 2 is cross-sectional view showing an example of a heat retaining unit within the heat treatment apparatus.
Figure 3:
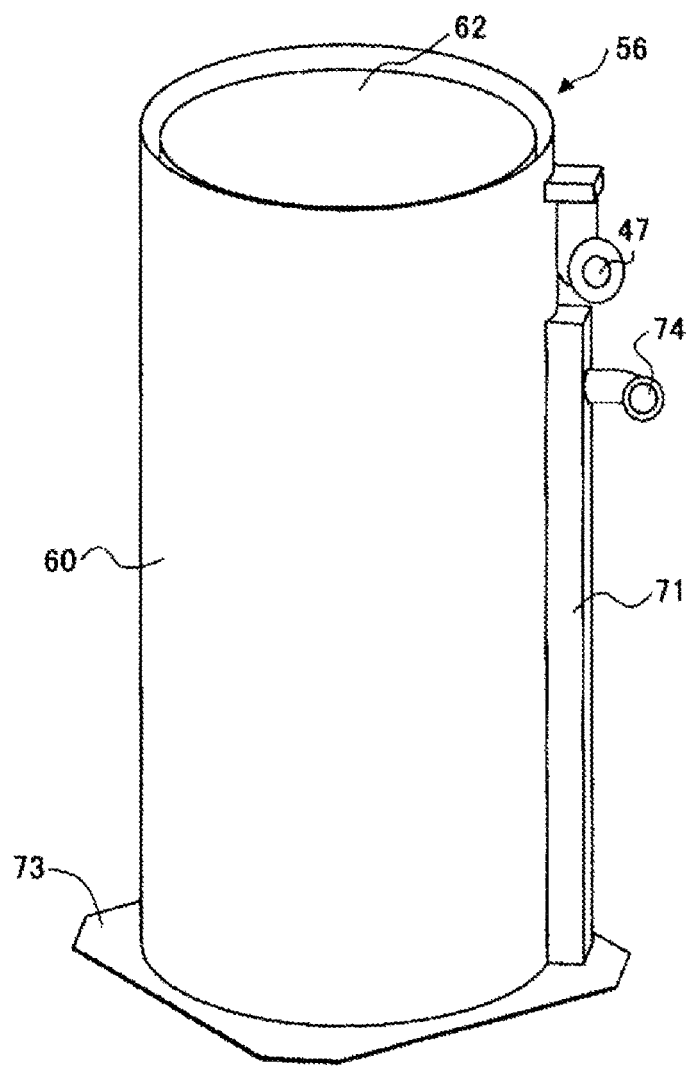
FIG. 3 is a perspective view of a heater in the heat treatment apparatus.

FIG. 2 is a cross-sectional view showing an example of the heat retaining unit 30 of the heat treatment apparatus 2. As shown in FIG. 2, the heat retaining unit 30 includes a ceiling plate 48 of a circular ring shape, a bottom plate 50 of a circular disk shape, and a plurality of (e.g., four) pillars 52 (only two pillars are shown in FIG. 2) disposed between the ceiling plate 48 and the bottom plate 50. Further, a plurality of pins 54 of a circular ring shape is installed in the middle of the pillars 52 at predetermined pitches.

Heat generated from a heating unit (which will be described later) is stored in the heat retaining unit 30 such that a temperature of a region of the lower end portion of the wafer boat 22 is not excessively lowered. While in this embodiment, the heat retaining unit 30 and the wafer boat 22 are provided independently of one another, they may be provided as an integrally-molded quartz body. In some embodiments, the heat retaining unit 30 may be formed in a cylindrical shape by quartz. That is to say, the heat retaining unit 30 may be used as a heat retaining tube.

A cylindrical heater 56 provided with a heater made of a carbon wire is installed to surround side and top portions of the processing container 4 such that the semiconductor wafers W received within the processing container 4 are heated. The heater 56 may be installed on, e.g., a base plate 55.

As shown in FIGS. 3 to 6, the heater 56 includes a tubular (or cylindrical) heat insulating member 57. The heat insulating member 57 is formed of silica and alumina as main ingredients. The heater 56 may be configured in various types as long as it can heat the processing container 4. As an example, the heater 56 may be configured as an infrared heater which radiates infrared rays toward the processing container 4 to heat the processing container 4. The heat insulating member 57 includes a thickness of, e.g., 30 to 40 mm. A linear heating resistor 58 is disposed along an inner circumference of the heat insulating member 57 in a spiral shape (see FIGS. 4 and 6) or a meandering shape. The heating resistor 58 is divided into a plurality of zones in a height direction of the heater 56 such that temperatures of the respective zones are controlled independently of each other. Further, the heat insulating member 57 may be formed in a semicircle shape in consideration of constructability of the heating resistor 58 or the like. The heating resistor 58 is held by holding members 59 on an inner circumferential surface of the heat insulating member 57 (see FIG. 5).

An outer circumference of the heat insulating member 57 is covered with a cylindrical outer shell 60 formed of a metal material, e.g., a stainless steel, so as to maintain the shape of the heat insulating member 57 and also reinforce the heat insulating member 57. Further, an outer circumference of the outer shell 60 is covered with a water cooling jacket 61 such that the heat of the heater 56 does not influence the outside of the heater 56 (see FIGS. 5 and 6). An upper heat insulating member 62 is installed on the top of the heat insulating member 57 to cover a top portion of the upper heat insulating member 62. An upper plate 63 formed of a stainless steel is installed on the upper heat insulating member 62 to cover a top portion (upper end portion) of the outer shell 60.

The heater 56 includes a heat discharging system 65 configured to discharge an internal atmosphere of a space 64 formed between the heater 56 and the processing container 4 to the outside, and a cooling unit 66 configured to introduce a cooling fluid (e.g., air) into the space 64 and forcibly cool down the space 64. This configuration rapidly lowers a temperature of the wafer after the heat treatment, thus realizing a rapid processing or an enhanced throughput. For example, the heat discharging system 65 mainly includes an exhaust port 67 formed in the upper portion of the heater 56, and a heat discharging pipe (not shown) for connecting the exhaust port 67 and a factory exhaust system (not shown). An exhaust blower and a heat exchanger (both not shown) are installed in the heat discharging pipe.

The cooling unit 66 includes a plurality of annular flow channels 68 formed between the heat insulating member 57 and the outer shell 60 in a height direction, and a plurality of blowing holes 69 formed in the heat insulating member 57. The blowing holes 69 are formed such that a cooling fluid flowing through each of the annular flow channels 68 is obliquely blown toward the center of the heat insulating member 57, thus generating a swirl flow within the space 64 in a circumferential direction. The annular flow channels 68 are formed by attaching a plurality of band-like (or ring-like) heat insulating members 70 to the outer circumference of the heat insulating member 57 or by cutting away the outer circumference of the heat insulating member 57 in a ring pattern.

Figure 4:
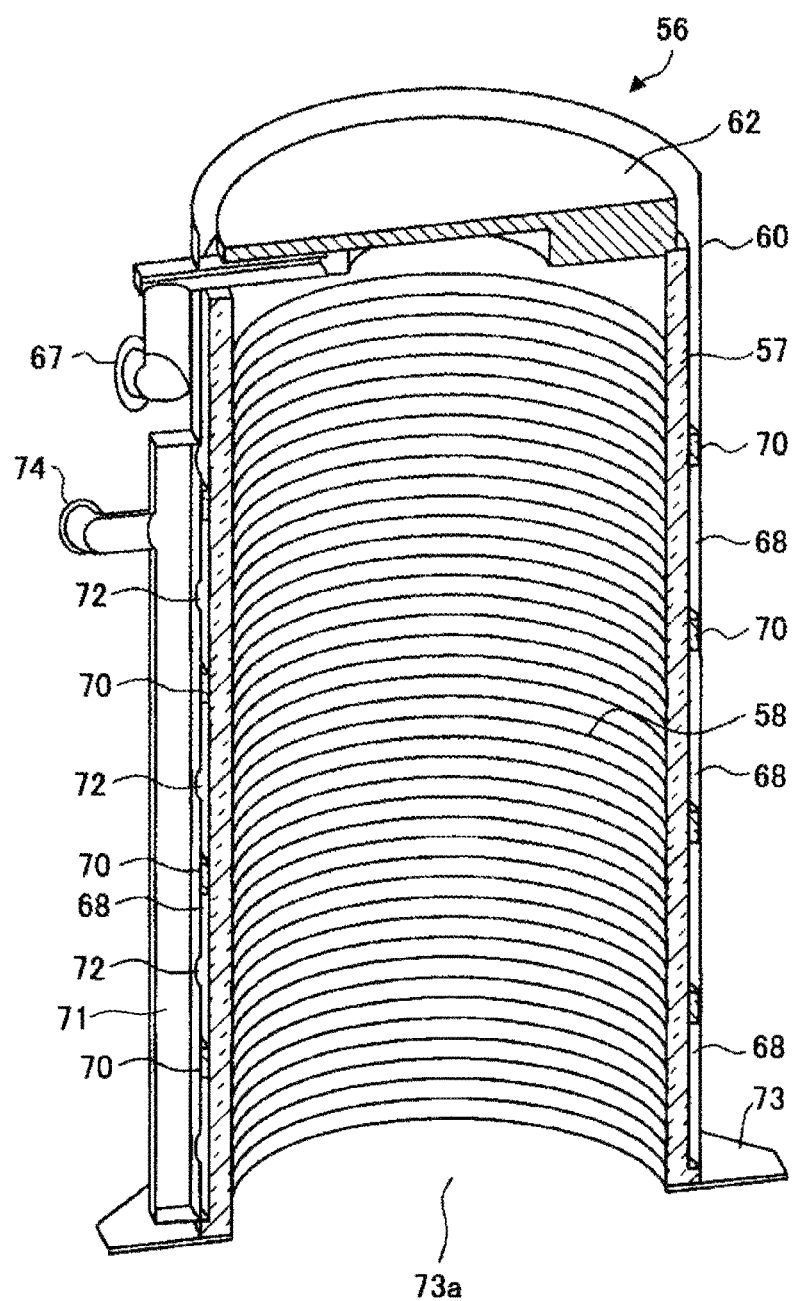
FIG. 4 is a cross-sectional perspective view of the heater in the heat treatment apparatus.
Figure 5:
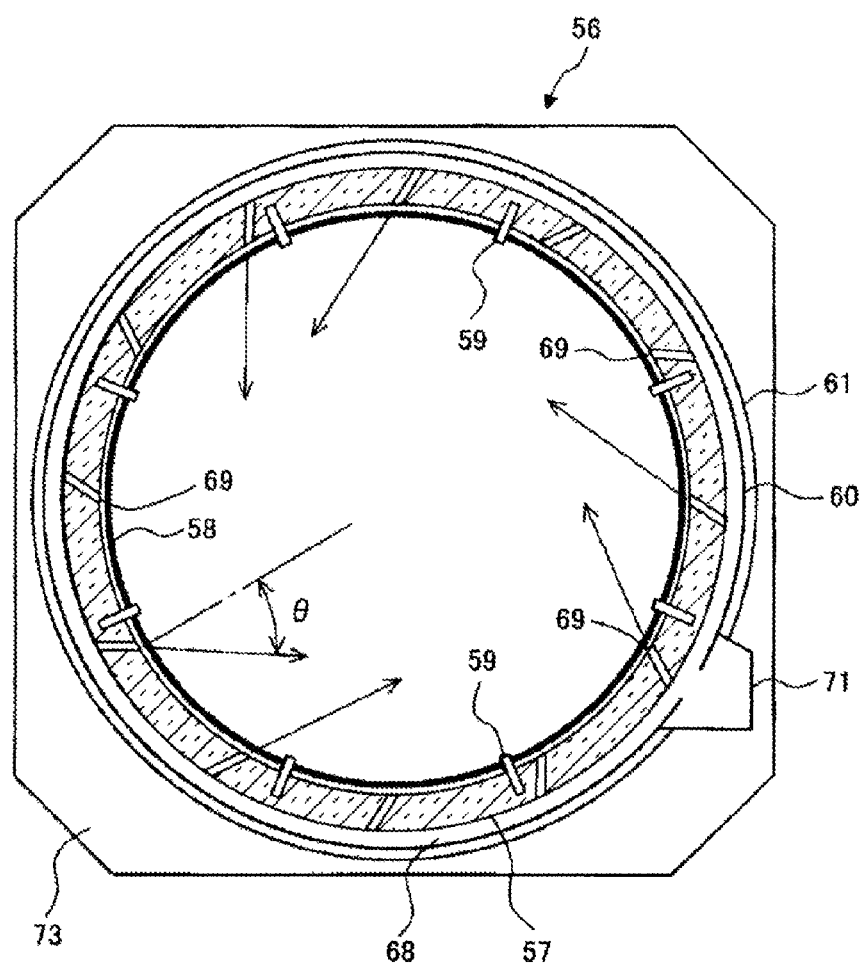
FIG. 5 is a cross-sectional view of the heater in the heat treatment apparatus.
Figure 6:
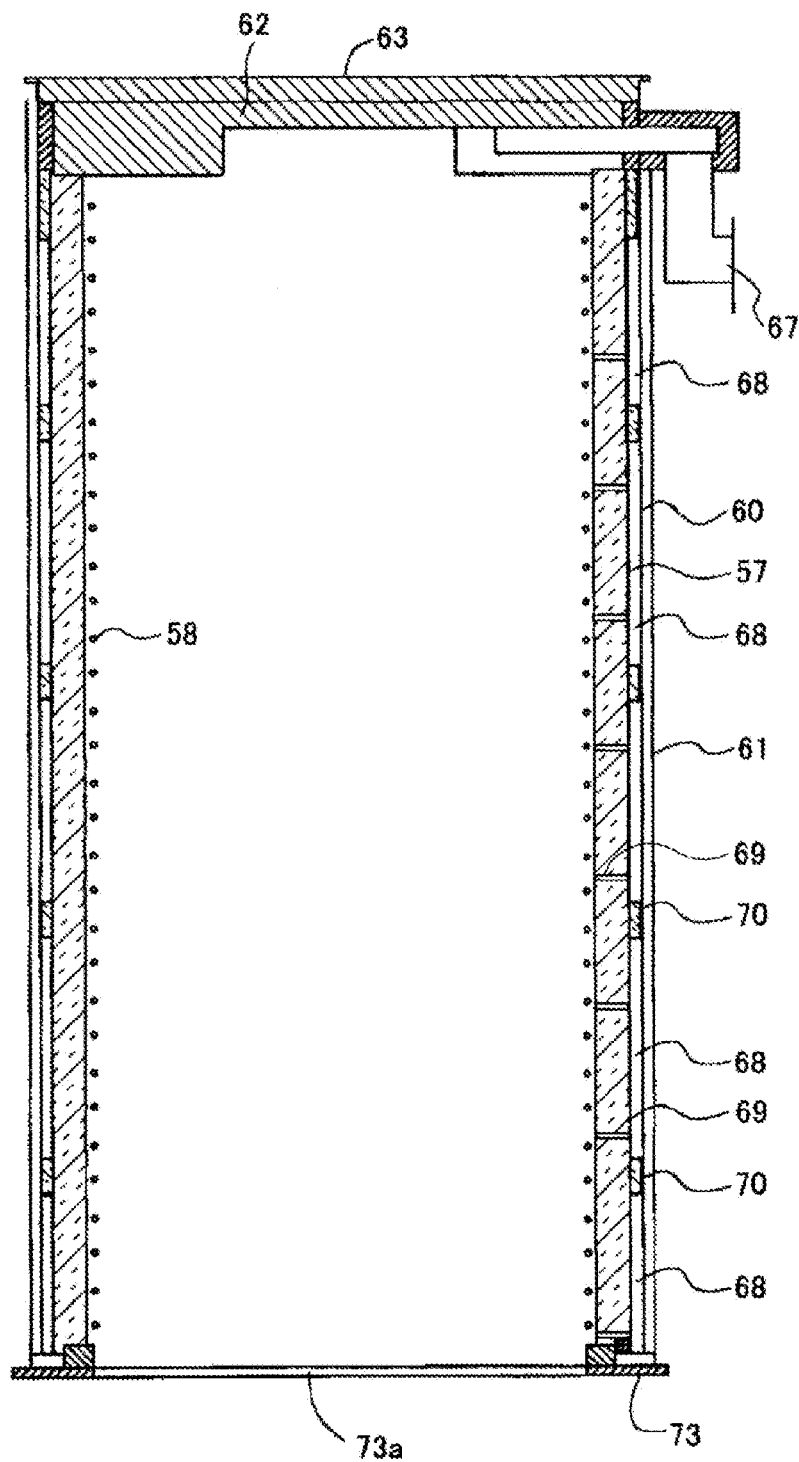
FIG. 6 is a longitudinal sectional view of the heater in the heat treatment apparatus.

In FIGS. 4 and 6, the ring-like heat insulating members 70 are formed to have a predetermined thickness (ranging from about 15 to 20 mm) and a predetermined width (ranging from about 30 to 50 mm). The heat insulating members 70 are inserted between the outer circumference of the heat insulating member 57 and the outer shell 60 in a height direction (axial direction) at predetermined intervals, while being fixed with an adhesive. By disposing the outer shell 60 in the outside of the heat insulating member 57 with the heat insulating member 70 interposed therebetween, the annular flow channels 68 are formed along the outer circumference of the heat insulating member 57 in the height direction in multiple stages.

The plurality of (e.g., four to fifteen) blowing holes 69 is formed at a substantially regular interval along the circumferential direction of the heat insulating member 57 within a range of each of the annular flow channels 68. Further, the blowing holes 69 may be formed in a first stage or second stages in the height direction within the range of each of the annular flow channels 68. Further, the blowing holes 69 may be formed to correspond to a temperature lowering speed designed for respective parts of the heater 56. The blowing holes 69 are formed to be inclined at a predetermined angle θ (e.g., 35 degree) toward the center of the heater 56 when viewed from the plane. This generates a flow of the cooling fluid which spirally flows in the circumferential direction of the space 64. For example, the blowing holes 69 are formed by piercing holes through an inner or outer side of the heat insulating member 57 with, e.g., a drill, before installing the outer shell 60.

In the space 64 within the heater 56, an ascending air current is generated by virtue of a suction/exhaust force caused by the exhaust port 67 which is formed in the top portion of the heater 56. Because of this, the blowing holes 69 need not to be formed in an obliquely upward direction. In FIG. 6, the blowing holes 69 are shown to be formed in the horizontal direction, but may be formed in the obliquely upward direction. In some embodiments, blowing nozzles may be embedded in the heat insulating member 57 instead of the blowing holes 69. In this case, leading end portions of the blowing nozzles may protrude to pass between vertically neighboring heating resistors 58.

A single common supply duct 71 configured to distribute and supply the cooling fluid to each of the annular flow channels 68 is installed in an outer surface of the outer shell 60 in a height direction. Communicating holes 72 through which the supply duct 71 and each of the annular flow channels 68 is in communication with each other, are formed in the outer shell 60. An inlet 74 of the supply duct 71 is coupled to a cooling fluid supply source (e.g., an air blower) (not shown) which suctions air (as the cooling fluid) existing within a clean room and forcibly feeds the same through an on-off valve (not shown). Further, a bottom plate 73 having an opening 73a formed at the center thereof is installed in a lower portion of the heater 56. The bottom plate 73 is fixed on the base plate 55 by a bolt or the like.

As described above, a mechanism which is configured to supply the cooling fluid into the space 64 defined between the processing container 4 and the heater 56 is installed. With this configuration, after a heat treatment is performed on the waters W of one batch, the cooling fluid is supplied into the space 64 to rapidly cool down the processing container 4, thus proceeding to the heat treatment for the wafers W of a subsequent batch. This increases productivity of the heat treatment apparatus 2.

Meanwhile, if the cooling fluid is supplied into the space 64 after the heat treatment, the discharge pipe 10 installed in the space 64 is rapidly cooled down. Thus, it is likely that a by-product generated during the heat treatment is condensed within the discharge pipe 10. However, in the heat treatment apparatus 2 according to this embodiment, the heat insulating member 90 is installed to surround the discharge pipe 10, thus suppressing the interior of the discharge pipe 10 from being rapidly cooled down. This prevents the by-product from condensing within the discharge pipe 10, thus preventing the by-product from adhering to the interior of the discharge pipe 10.

Further, referring back to FIG. 1, the heat treatment apparatus 2 includes a control unit 80 which is implemented with a microcomputer or the like to control a gas supply amount, a process temperature, a process pressure and the like, or control the entire operation of the heat treatment apparatus 2. The control unit 80 includes a storage medium 82 to store a program used when controlling the entire operation of the heat treatment apparatus 2. Further, when supplying the cooling fluid into the space 64 after the heat treatment, the control unit 80 may be configured to control respective components of the heat treatment apparatus 2, including controlling a flow rate of the cooling fluid, or the like.

The storage medium 82 may include, e.g., a flexible disk, a compact disk (CD), a hard disk, a flash memory, a DVD or the like. Further, although not being shown in drawings, various instructions, programs or the like may be inputted to the control unit 80 through a user interface using a dedicated line.

Figure 7A:
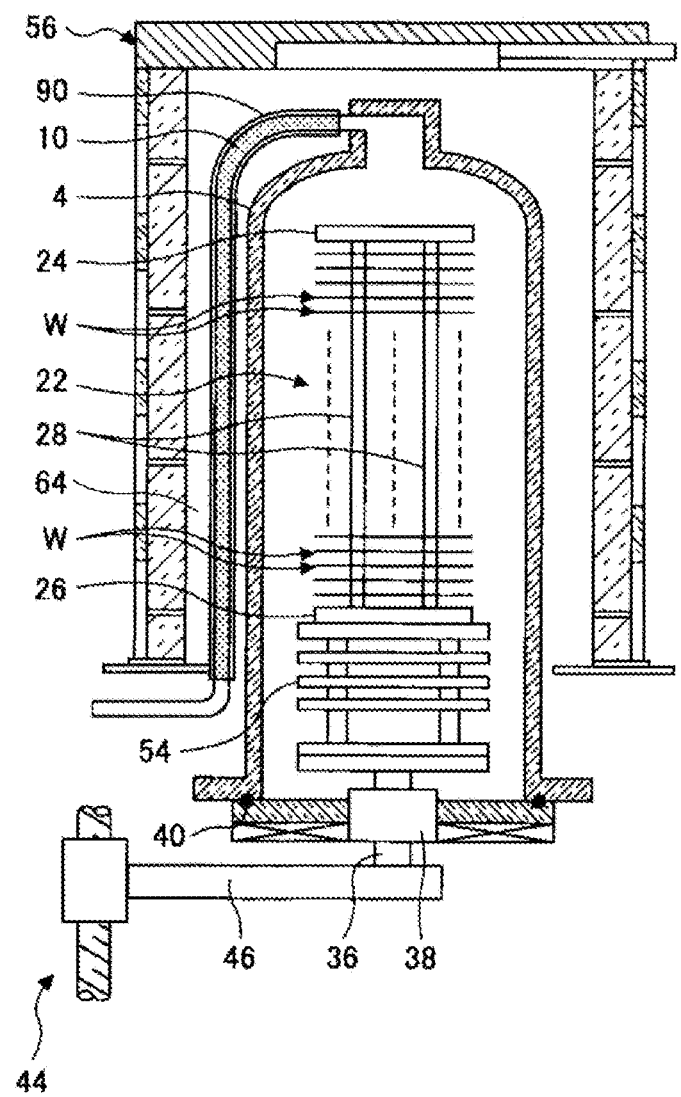
FIGS. 7A and 7B are views showing a detailed configuration of a heat insulating member which is installed around a discharge pipe of the heat treatment apparatus according to an embodiment of the present disclosure.
Figure 7B:
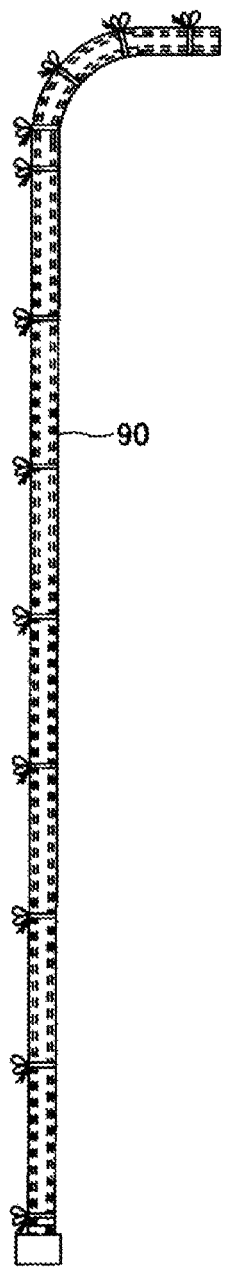

FIGS. 7A and 7B are views showing a detailed configuration of the heat insulating member 90 which is installed around the discharge pipe 10 of the heat treatment apparatus 2 according to the embodiment of the present disclosure. FIG. 7A is a view showing an example of a region in which the heat insulating member 90 is installed, and FIG. 7B is a view showing an example of the heat insulating member 90 is installed around the discharge pipe 10.

As shown in FIG. 7A, the discharge pipe 10 is installed in the space 64 defined between the exterior of the processing container 4 and the interior of the heater 56. The discharge pipe 10 communicates with the interior of the processing container 4 at the top portion of the processing container 4. The discharge pipe 10 is installed to: horizontally extend from the top portion of the processing container 4 by a substantially radius of the processing container 4; be bent in an arc shape; extend in a vertical downward direction along an outer wall of the processing container 4; and be bent in a horizontal outward direction at the vicinity of the lower end portion of the processing container 4. That is to say, the discharge pipe 10 as a whole is installed to extend in a substantially vertical direction from the top portion of the processing container 4 toward the lower end portion thereof. Through the discharge pipe 10 configured as above, the processing container 4 is in communication with the outside.

As shown in FIG. 7B, the heat insulating member 90 is installed to substantially cover the overall circumference of the discharge pipe 10 disposed within the space 64. With this configuration, even if the cooling fluid is supplied into the space 64 to perform an air cooling process, the discharge pipe 10 may be kept warm by being insulated from the cooling fluid, thus suppressing the interior of the discharge pipe 10 from being cooled down.

Figure 8A:
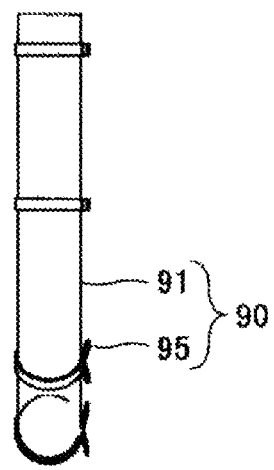
Figure 8C:
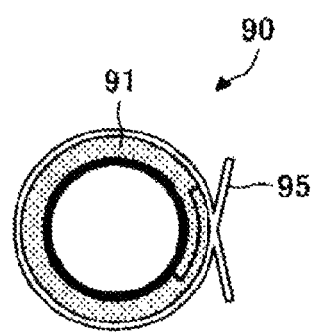

FIGS. 8A to 8C are views showing a detailed configuration of the heat insulating member 90 shown in FIGS. 7A and 7B. FIG. 8A is a front view of the heat insulating member 90, FIG. 8B is a side view of the heat insulating member 90, and FIG. 8C is a cross-sectional view of the heat insulating member 90.

As shown in FIGS. 8A to 8C, the heat insulating member 90 includes a cover 91 and fixing parts 95. The cover 91 has a sufficient area to cover the circumference of the discharge pipe 10. The fixing parts 95 are installed to fix the cover 91 to the circumference of the discharge pipe 10. The heat insulating member 90 may be formed of various materials as long as they have a sufficient heat resistance against the heat treatment. Further, such materials do not interfere with radiation of heat generated from the heater 56 to the discharge pipe 10 during the heat treatment, and suppresses the interior of the discharge pipe 10 from being cooled down during a cooling process after the heat treatment.

The heat resistance required for the heat insulating member 90 may be determined in consideration of the purpose of the heat treatment and a heat treatment temperature. As an example, a material which can endure at a temperature of 350 degrees C. or higher may be selected as the material of the heat insulating member 90. The reason for this is that, in most cases, since a by-product is generated when a heating temperature is equal to or higher than 200 degrees C., an upper limit of the heat treatment temperature is generally set to about 350 degrees C. Further, the upper limit of the heat resistance is not particularly limited, but may be set to 500 degrees C. in consideration of an actual process. That is to say, in general, a material having a heat resistance temperature of from 350 to 500 degrees C. may be properly used as the material of the heat insulating member 90.

For example, if the heater 56 is an infrared heater and if the heat insulating member 90 is formed of a metal material, infrared rays generated from the heater 56 are reflected at the heat insulating member 90, thus hindering the radiation of heat to the discharge pipe 10 in many cases. Meanwhile, for example, a material having a sufficient heat resistance such as a glass cloth can transfer the infrared rays of the heater 56 to the discharge pipe 10 during a heating process, and can insulate the discharge pipe 10 from the cooling fluid during a cooling process, thus keeping the discharge pipe 10 warm. For this reason, the heat insulating member 90 may be formed of the glass cloth.

In some embodiments, the heat insulating member 90 may be made of other cloths than the glass cloth as long as they have a sufficient heat resistance, can transfer the infrared rays of the heater 56 to the discharge pipe 10, and can prevent the interior of the discharge pipe 10 from being cooled down by a supplied cooling fluid. When the heat insulating member 90 is made of the other cloths, the cover 91 may be configured by a cloth having a sufficient area and shape to cover the discharge pipe 10 by winding around the discharge pipe 10. In this case, examples of the fixing parts 95 may include straps. With this configuration, the cover 91 can cover the circumference of the discharge pipe 10 by winding around the discharge pipe 10 using the straps, thus installing the heat insulating member 90 around the discharge pipe 10.

In this case, as shown in FIGS. 8A to 8C, the straps 95 may be installed at appropriate intervals in a longitudinal direction of the cover 91 with a significant simplified design. In this case, since an adhesive or the like is not necessary, there is no possibility of generating impurities within the heat treatment apparatus 2.

Figure 9B:
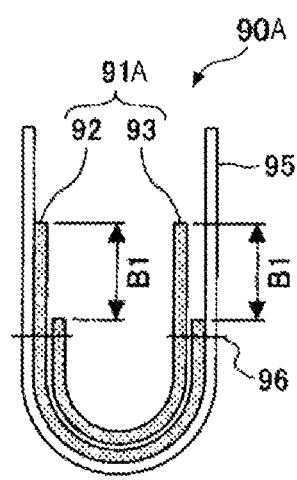

FIGS. 9A and 9B are views showing an example of a configuration of another heat insulating member 90A for covering the discharge pipe 10 of the heat treatment apparatus 2 according to another embodiment of the present disclosure. FIG. 9A is a plane view of the cover 91A of the heat insulating member 90A, and FIG. 9B is a cross-sectional view of the heat insulating member 90A.

As shown in FIG. 9A, the cover 91A of the heat insulating member 90A may be of, e.g., an elongated rectangular shape. The cover 91A has a sufficient length L to cover an approximate overall length of the discharge pipe 10 in a longitudinal direction. Further, the cover 91A has a sufficient width B to cover the circumference of the discharge pipe 10 without a gap in a widthwise direction (or transverse direction). Thus, the cover 91A may sufficiently serve to insulate the discharge pipe 10 from the cooling process, thereby keeping the discharge pipe 10 warm. Further, the straps 95 are installed to be spaced apart from one another by a predetermined interval, thus evenly install the heat insulating member 90A around the discharge pipe 10 in the longitudinal direction of the heat insulating member 90A.

As shown in FIG. 9B, the cover 91A may be made by seaming two sheets of overlapped cloths 92 and 93 with a string 96 or the like. In this case, both ends of the overlapped cloths 92 and 93 are formed to have an extended portion of a predetermined width B1 in the widthwise direction. The two extended portions of the both ends of the overlapped cloths 92 and 93 are combined with the straps 95 while being overlapped with each other at the predetermined width B1. This configuration makes a thickness of the heat insulating member 90A wound around the circumference of the discharge pipe 10 uniform over the entire length of the heat insulating member 90A, thus achieving a uniform heat transfer efficiency. In some embodiments, the predetermined width B1 may be adjusted to an appropriate dimension such that the two extended portions are accurately overlapped with each other when the cover 91A is wound around the discharge pipe 10 depending on a diameter size of the discharge pipe 10.

In this manner, the two sheets of cloths 92 and 93 are overlapped with each other while being deviated from each other by the predetermined width B1, thus making the thickness of the heat insulating member 90A wound around the discharge pipe 10 uniform, over the entire circumference of the discharge pipe 10. This allows a uniform heat transfer over the entire circumference of the discharge pipe 10 during both the heating and cooling processes. In some embodiments, the straps 95 may be wound around the outer circumference of the cover 91A a plurality of times, followed by being bound and fixed.

In some embodiments, each of the cloths 92 and 93 may be made by overlapping a plurality of thin cloths. As an example, each of the cloths 92 and 93 may be made by overlapping two sheets of thin cloths. That is to say, four sheets of thin cloths may be overlapped with each other to cover the circumference of the discharge pipe 10.

Examples

Figure 10:
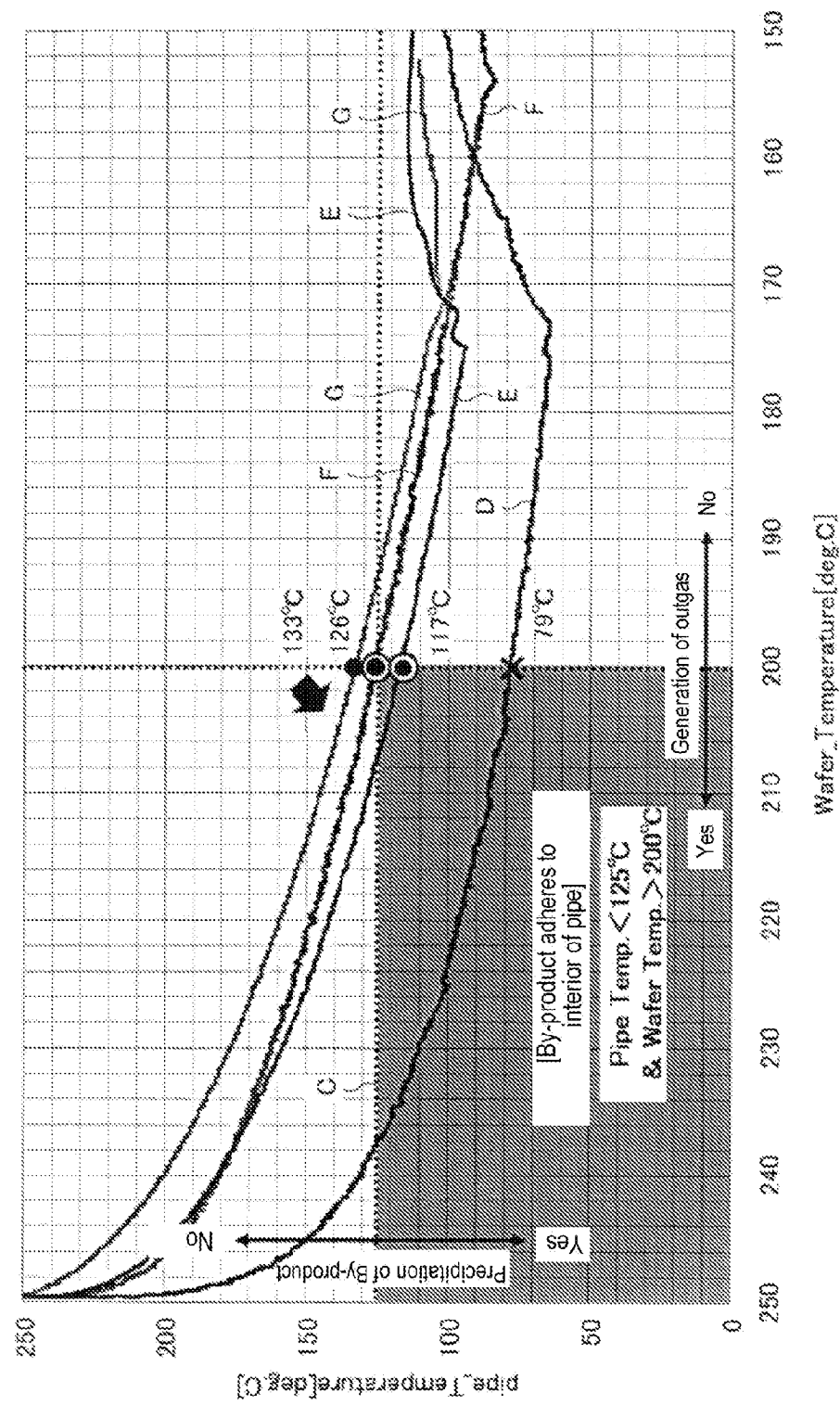
FIG. 10 is a view showing results of an example obtained by performing the heat treatment apparatus and the heat treatment method according to an embodiment of the present disclosure.

FIG. 10 is a view showing results of an example in which the heat treatment apparatus and a heat treatment method according to embodiments of the present disclosure are applied. In FIG. 10, a horizontal axis represents a temperature (degrees C.) of the wafer and a vertical axis represents a temperature (degrees C.) of the discharge pipe 10. When the temperature of the wafer is equal to or higher than 200 degrees C., an outgas is generated. Further, the outgas refers to various gasses produced from an organic material or the like in a vacuum environment. Further, the outgas may include a gas produced from a resist, a deposition material or the like.

Further, when the temperature of the discharge pipe 10 is equal to or lower than 125 degrees C., a by-product adheres to the interior of the discharge pipe 10. Accordingly, as shown in FIG. 10, in a state of a region C, that is, when the temperature of the wafer is equal to or higher than 200 degrees C. and when the temperature of the discharge pipe 10 is equal to or lower than 125 degrees C., the by-product is precipitated in the interior of the discharge pipe 10, thus adhering to the interior of the discharge pipe 10.

In addition, in this example, a temperature characteristic was measured by appropriately changing an output of the cooling unit 66 after the heat treatment. Also, in this example, for the sake of easier understanding, components corresponding to the components described in the above embodiment will be designed by the same reference numerals. The glass cloth was used as the heat insulating member 90.

A curve D represents a measurement result when a cooling output of the cooling unit 66 was set to be 100% without the installation of the heat insulating member 90 to the discharge pipe 10. A considerable portion of the curve D is included in the region C so that the by-product naturally adheres to the interior of the discharge pipe 10.

A curve E represents a measurement result which was obtained from the vicinity of the vertex of the processing container 4 where the by-product is relatively hard to adhere thereto, when the cooling output of the cooling unit 66 was set to be 100%, without the installation of the heat insulating member 90 to the discharge pipe 10. Even though a portion of the curve E included in the region C is smaller than that of the curve D, the by-product also adheres to the interior of the discharge pipe 10.

A curve F represents a measurement result when the cooling output of the cooling unit 66 was lowered to 30% without the installation of the heat insulating member 90 to the discharge pipe 10. By lowering the cooling output, the by-product was not adhered to the interior of the discharge pipe 10. However, the lowering of the cooling output prolongs a time interval during which the heat treatment is continually performed, thus resulting in a degraded throughput.

A curve G represents a measurement result when the cooling output of the cooling unit 66 was set to be 100% with the heat insulating member 90 installed to the discharge pipe 10. Any portion of the curve G is not included in the region C. Thus, there is no any deposit in the interior of the discharge pipe 10. Moreover, since the cooling output of the cooling unit 66 is 100%, throughput may be maximized.

As described above, according to the heat treatment apparatus and the heat treatment method applied to this example, even when the cooling process is performed on the processing container 4 after the heat treatment, it is possible to suppress a by-product from being generated within the discharge pipe 10.

The above embodiments were described with a focus on the case where the cooling process is performed on the processing container 4 after the heat treatment. However, the present disclosure is not limited thereto. In some embodiments, the heat treatment apparatus and the heat treatment method according to the present disclosure may be applied to a case in which a by-product is precipitated in a discharge pipe even when a cooling process is not performed after a heat treatment. The heat treatment apparatus and the heat treatment method according to the present disclosure may be applied to any case in which a by-product is generated within a discharge pipe regardless of the presence and absence of a cooling process after a heat treatment.

According to the present disclosure in some embodiments, it is possible to suppress a condensate from being generated within a discharge pipe even after a heat treatment is terminated.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A heat treatment apparatus, comprising:
a processing container configured to perform a heat treatment on substrates accommodated in the processing container;
a heating unit configured to cover an outer circumference of the processing container with a predetermined space defined between the heating unit and the processing container;
a discharge pipe installed outside of the processing container and within the predetermined space, and configured to communicate with an interior of the processing container to discharge an exhaust gas from the interior of the processing container; and
a heat insulating member configured to cover a circumference of the discharge pipe,
wherein the heat insulating member is installed to substantially cover the overall circumference and the entire length of the discharge pipe disposed within the predetermined space.

2. The apparatus of claim 1, wherein the heating unit includes an infrared heater configured to radiate infrared rays, and
the heat insulating member is formed of a material that transmits the infrared rays through the heat insulating member.

3. The apparatus of claim 1, wherein a heat-resistant temperature of the heat insulating member is equal to or higher than 350 degrees C.

4. The apparatus of claim 1, wherein the heat insulating member is formed of an elongated cloth configured to cover the discharge pipe in a longitudinal direction.

5. The apparatus of claim 4, wherein the heat insulating member includes straps configured to fix the elongated cloth to the circumference of the discharge pipe.

6. The apparatus of claim 4, wherein the heat insulating member includes two sheets of cloths which are seamed while being deviated in a transverse direction,
central portions of the two sheets of cloths are overlapped with each other in the transverse direction, and both ends of the two sheets of cloths include one sheet of extended portion.

7. The apparatus of claim 6, wherein the central portions and the both ends of the two sheets of cloths are adjusted such that a total thickness of the two sheets of cloths wound around the circumference of the discharge pipe is uniform over the entire circumference of the discharge pipe.

8. The apparatus of claim 4, wherein the heat insulating member is formed of a glass cloth.

9. The apparatus of claim 1, wherein the discharge pipe is formed of quartz.

10. The apparatus of claim 1, wherein the processing container is formed of quartz.

11. The apparatus of claim 1, wherein the processing container is of a lengthwise long shape to accommodate the substrates in multiple stages.

12. The apparatus of claim 1, further comprising: a holding unit disposed within the processing container and configured to hold the substrates at predetermined vertical intervals in multiple stages,
wherein the substrates are subjected to the heat treatment while being held by the holding unit within the processing container.

13. The apparatus of claim 1, further comprising: a cooling unit configured to cool down the predetermined space.

14. The apparatus of claim 13, further comprising: a control unit configured to control the heating unit to perform the heat treatment, and control the heating unit to stop after the heat treatment, and control the cooling unit to operate.

15. A heat treatment method, comprising:
accommodating substrates within a processing container;
heating, by a heating unit, the processing container from a circumference of the processing container such that the substrates are subjected to a heat treatment;
discharging gas generated within the processing container through a discharge pipe, the discharge pipe being installed in a space between the processing container and the heating unit and a circumference of the discharge pipe is covered with an heat insulating member;
stopping the heating by the heating unit to complete the heat treatment for the substrates; and
cooling down the space between the processing container and the heating unit,
wherein the heat insulating member is installed to substantially cover the overall circumference and the entire length of the discharge pipe disposed within the space.

16. The method of claim 15, wherein heating by the heating unit is performed by radiating infrared rays, and
the heat insulating member is configured to transmit the infrared rays therethrough such that the discharge pipe is heated, and in cooling down the space, to prevent the discharge pipe from being cooled down by insulating.

17. The method of claim 16, wherein, in cooling down the space, a by-product is prevented from adhering to the interior of the discharge pipe by insulation of the heat insulating member.

18. The method of claim 17, wherein the heating by the heating unit is performed at a temperature equal to or higher than 200 degrees C., and
in cooling down the space, the temperature of the discharge pipe is maintained at a temperature equal to or higher 125 degrees C.

* * * * *